United States Patent
Qin et al.

(10) Patent No.: US 10,651,840 B2
(45) Date of Patent: May 12, 2020

(54) LOW QUIESCENT CURRENT POWER ON RESET CIRCUIT

(71) Applicant: Analog Devices Global Unlimited Company, Hamilton (BM)

(72) Inventors: Felix Qin, Shanghai (CN); Eric C. Gaalaas, Bedford, MA (US); Bikiran Goswami, Burlington, MA (US); Jason Ma, Shanghai (CN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/954,204

(22) Filed: Apr. 16, 2018

(65) Prior Publication Data

US 2019/0319616 A1    Oct. 17, 2019

(51) Int. Cl.
| H03L 7/00 | (2006.01) |
| H03K 17/22 | (2006.01) |
| H03K 17/16 | (2006.01) |
| H03K 3/037 | (2006.01) |

(52) U.S. Cl.
CPC .......... *H03K 17/223* (2013.01); *H03K 3/037* (2013.01); *H03K 17/161* (2013.01)

(58) Field of Classification Search
CPC .... A61B 17/07207; A61B 2017/00398; A61B 2017/0046; A61B 2017/00734; H05B 37/0272
See application file for complete search history.

(56) References Cited

U.S. PATENT DOCUMENTS

| 5,528,184 A | 6/1996 | Gola et al. |
| 5,703,510 A | 12/1997 | Iketani et al. |
| 5,831,460 A | 11/1998 | Zhou |
| 6,515,523 B1 | 2/2003 | Bikulcius |
| 7,057,427 B2 | 6/2006 | Wadhwa et al. |
| 2003/0191596 A1* | 10/2003 | Smit .................. G06F 1/26 702/94 |
| 2004/0239413 A1 | 12/2004 | Gubbins |

(Continued)

FOREIGN PATENT DOCUMENTS

WO    WO-2012174810 A1    12/2012

OTHER PUBLICATIONS

"Taiwanese Application Serial No. 108113181, Office Action dated Nov. 4, 2019", W/O English Translation, 11 pgs.

*Primary Examiner* — Sibin Chen
(74) *Attorney, Agent, or Firm* — Schwegman Lundberg & Woessner, P.A.

(57) ABSTRACT

A device for providing a reset signal to one or more sequential logic circuits in an electronic system responsive to a supply voltage condition includes a first voltage detector circuit to generate a first pulse after the supply voltage rises to a first threshold voltage level. The device further includes a second voltage detector circuit to generate a second pulse after the supply voltage falls below a second threshold voltage level. The device additionally includes a latch circuit to store a first value based on the first pulse after the supply voltage rises to the first threshold voltage level, disable the first voltage detector circuit after storing the first value, reset to store a second value based on the second pulse after the supply voltage falls below the second threshold voltage level, and to disable the second voltage detector circuit after the resetting.

20 Claims, 5 Drawing Sheets

(56) References Cited

U.S. PATENT DOCUMENTS

| | | | | |
|---|---|---|---|---|
| 2007/0079147 A1* | 4/2007 | Pyeon | ............... | G06F 1/24 |
| | | | | 713/300 |
| 2011/0025377 A1* | 2/2011 | Lueger | ............... | H03K 19/0008 |
| | | | | 326/93 |
| 2014/0077842 A1* | 3/2014 | Zhang | ............... | G06F 1/30 |
| | | | | 327/72 |

* cited by examiner

LOW QUIESCENT CURRENT POWER ON RESET CIRCUIT

FIELD OF THE DISCLOSURE

This document pertains generally, but not by way of limitation, to electronic circuits, and more particularly, to reset circuits for electrical systems.

BACKGROUND

Electronic systems that use sequential logic circuits typically include a reset circuit to force memory elements of these systems to specified states in response to power supply events, such as a power supply voltage rising above a threshold operating voltage level when a system is powered on or a power supply voltage falling below another threshold operating voltage level during operation of the system. A power on reset (POR) circuit, for example, can monitor a rising supply voltage to a system after the system is turned on, and generate a reset signal to reset one or more latches in the system to a specified state after the supply voltage rises to a voltage level required for normal functioning of other circuits in the system. Similarly, a brown-out detection circuit can monitor a supply voltage of a system during operation of the system, and a generate a signal to reset the system when the supply voltage drops below a voltage level required for the normal functioning of circuits in the system. The performance of a POR circuit or a brown-out detection circuit can be affected by the rates at which a supply voltage rises or falls, and by quiescent current consumed by these circuits.

Figure 1A:
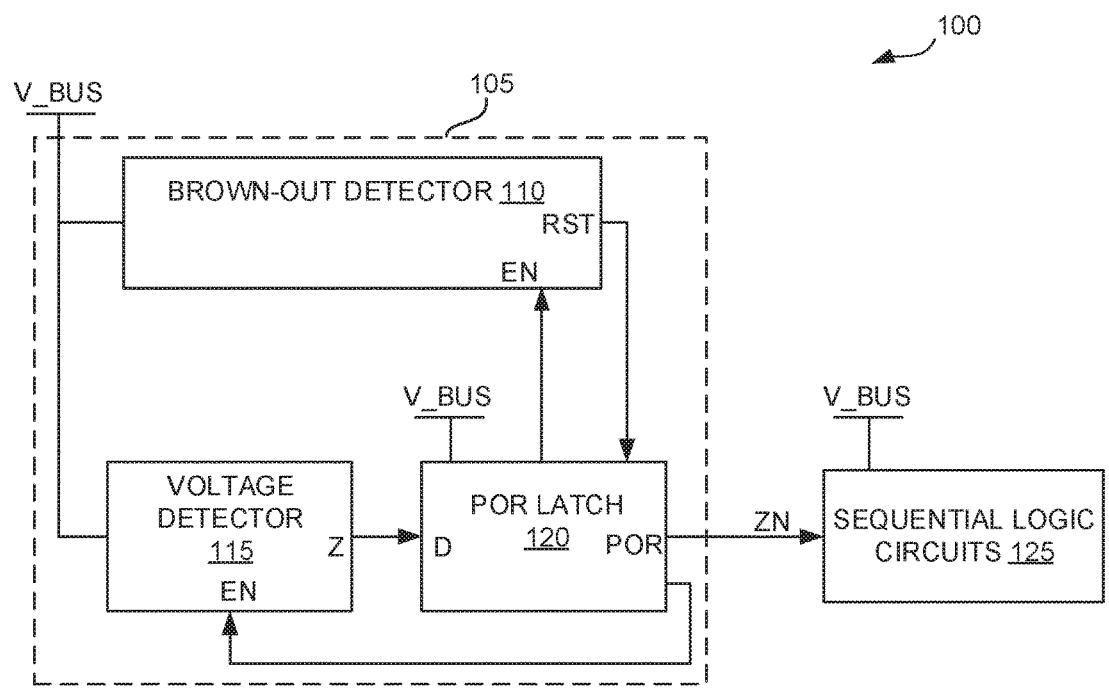
FIG. 1A depicts a block diagram of a system having a low quiescent current reset circuit, according to various embodiments.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a low quiescent current reset circuit that is resilient to process-voltage-temperature (PVT) variations and power supply ramp characteristics, and includes a power-on-reset (POR) circuit and a brown-out detection circuit which can be automatically disabled using a latch circuit to reduce quiescent current consumption. The low quiescent current reset circuit can improve the battery life and the stability of systems having one or more sequential logic circuits by reducing power consumption during normal operation. The low quiescent current reset circuit additionally includes a leakage current compensation circuit, such as to provide robustness to a range of power supply slew rates and PVT variations. This can be particularly useful for detecting and responding to low slew rate power supply interruptions, such as a slow drop in a supply voltage level below an operating threshold.

FIG. 1A depicts a block diagram of a system 100 having a low quiescent current reset circuit 105, according to various embodiments. The system 100 can include an electronic device having one or more sequential logic circuits 125, such as microprocessors, finite state machines, register banks, and any other circuits that incorporate latch circuits or other memory elements. Although the reset circuit 105 is shown as being separate from the one or more sequential logic circuits 125, in some devices, the reset circuit 105 can be a device or circuit within the one or more sequential logic circuits, such as a microprocessor which includes an on-chip reset circuit to initialize the microprocessor to a known state on powerup.

In FIG. 1A, the reset circuit 105 can include a POR circuit including a voltage detector circuit 115, a brown-out detector circuit 110, and POR latch 120. The voltage detector circuit 115 can monitor a supply voltage (V_BUS) as it rises from a power-off potential to a rising threshold voltage level. The rising threshold voltage level can be a specified minimum supply voltage level required to enable the one or more sequential logic circuits 125 to properly operate. The voltage detector 115 can generate a reset signal at output terminal Z to reset the one or more sequential logic circuits 125 while V_BUS rises from a low or power-off voltage level to the rising threshold voltage level. The voltage of the reset signal can follow, or track, the rise of V_BUS, such as to indicate a high, or logical 1, reset value. The reset signal may be received by the POR latch 120 at an input terminal D, and can be conducted to output terminal POR, such as be provided to the one or more sequential logic circuits 125.

The voltage detector 115 can change the reset signal generated at output terminal Z to a low, or logical 0, value after detecting V_BUS rise above the rising threshold voltage level, such as to indicate that the supply voltage has risen to a level sufficient to enable operation of the one or more sequential logic circuits 125. The POR latch 120 can latch, or store, the low valued reset signal, such as by electrically isolating the input D of the POR latch from the output terminal Z of the voltage detector 115. The low valued reset signal can be provided to the one or more sequential logic circuits 125, such as to disable the reset function. The POR latch 120 can also provide a control signal to a gating terminal EN of the voltage detector circuit 115 to disable the voltage detector circuit, such as to reduce the quiescent current consumed by the voltage detector circuit. The POR latch 120 can continue to provide the low valued reset signal (ZN) to the one or more sequential logic circuits after the voltage detector circuit 115 is disabled.

In FIG. 1A, the brown-out detector circuit 110 can monitor V_BUS to detect a drop in a supply voltage below a high-falling threshold voltage level. The high-falling threshold voltage level can be a voltage below the maximum or normal operating voltage of the system 100, selected to provide an overhead operating voltage, such as to delay turning on a voltage detector circuit, as described herein. The brown-out detector circuit 110 can turn on a second voltage detector circuit, similar to the voltage detector circuit 115, to detect V_BUS falling below a low-falling threshold voltage level. The low-falling threshold voltage level can be a specified minimum voltage for resetting the one or more sequential logic circuits 125 in response to a drop in a supply voltage. The brown-out detector circuit 110 can generate a reset signal at terminal RST to reset the POR latch 120, such as to cause the POR latch to store a high or logic 1 reset value, after the second voltage detector circuit detects V_BUS falling below the low-falling threshold voltage level. The POR latch 120 then generate a second control signal at a gating terminal EN of the brown-out detector circuit 110 to disable the second detector circuit, such as to reduce the quiescent current consumed by the second detector circuit. The POR latch 120 can continue to provide the high reset signal to the one or more sequential logic circuits after the second voltage detector circuit is disabled.

Figure 1B:
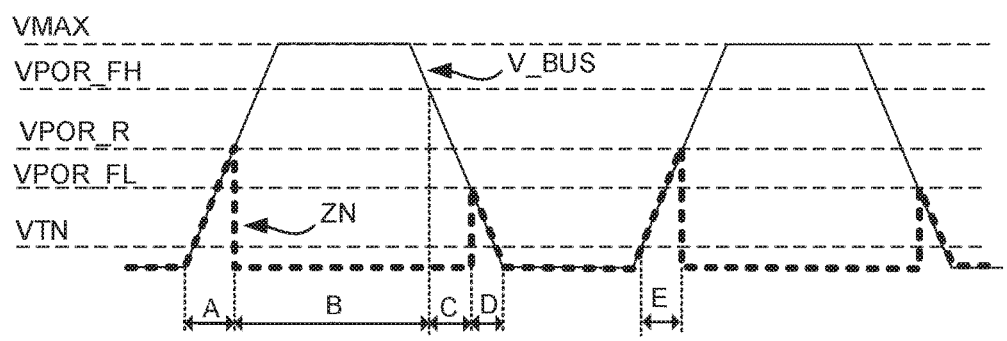
FIG. 1B depicts an example of a waveform diagram of a supply voltage and a reset signal associated with a low quiescent current reset circuit, according to various embodiments.

FIG. 1B depicts an example of a diagram showing waveforms of a supply voltage and a reset signal associated with a low quiescent current reset circuit, according to various embodiments. Such waveforms can be examples of a supply voltage V_BUS applied to the reset circuit 100 and the reset signal ZN generated by the reset circuit to reset the one or more sequential logic devices 125. The diagram indicates an N-type field-effect transistor (NFET) operating threshold voltage level VTN, a low-falling threshold voltage level VPOR_FL, a rising threshold voltage level VPOR_R, a high-falling threshold voltage level VPOR_FH, and maximum or normal operating voltage level VMAX, The region to the left of region A indicates a time when the system 100 is powered off, such as when V_BUS is below the threshold voltage VTN of NFETs in the system, such as an NFET device in the voltage detector 115. In this region, both the voltage detector 115 and the voltage detector in the brown-out detector 110 can be turned off. Region A indicates a period when V_BUS rises from VTN to VPOR_R. In region A, the voltage detector circuit 115 can be turned on to monitor V_BUS, such as to detect V_BUS rising above VPOR_R. A current flows through the voltage detector circuit 115 in during this period, causing the voltage detector circuit 115 to consume power. Region B indicates a period when V_BUS is higher than both VPOR_R and VPOR_FH. In this region, voltage detector 115 can be turned off, causing the voltage detector to conduct little or no current. Consequently, neither voltage detector consumes power in region B. Region C indicates a period where the second voltage detector in the brown-out detector 110 is activated to detect a drop in V_BUS below VPOR_FL. The second voltage detector circuit conducts are current during this period, causing the second voltage detector to consume power. Region D indicates a period when V_BUS falls below VPOR_FL, causing the second voltage detector to reset the POR latch 120, such as to cause the POR latch to drives the value of the reset signal ZN high, such as to cause ZN to follow V_BUS. The second voltage detector is turned off during this period, causing the second voltage detector to conduct little or no current. Consequently, neither voltage detector consumes power during this period. Region E indicates a time, similar to the period shown in region A, when V_BUS rises to VPOR_R after a falling reset of the system 100.

In some embodiments, VPOR_FH can be adjusted, such as to reduce power consumed by the second voltage detector in region C or to adapt the reset circuit 105 for different power supply slew rates.

According to the techniques described herein, the waveform of ZN in region D can be reliably generated using the reset circuit of the present disclosure various process corner conditions and V_BUS characteristics, such as slew rate, when ambient temperature is lower than 100 degrees Celsius. The waveform on ZN in region D can be reliably generated for reasonable PVT variations when the supply voltage rise and fall times are less than 10 milliseconds. Additionally, the waveform of ZN in region E can be reliably generated independent of PVT variations and supply voltage rise and fall times.

Figure 2A:
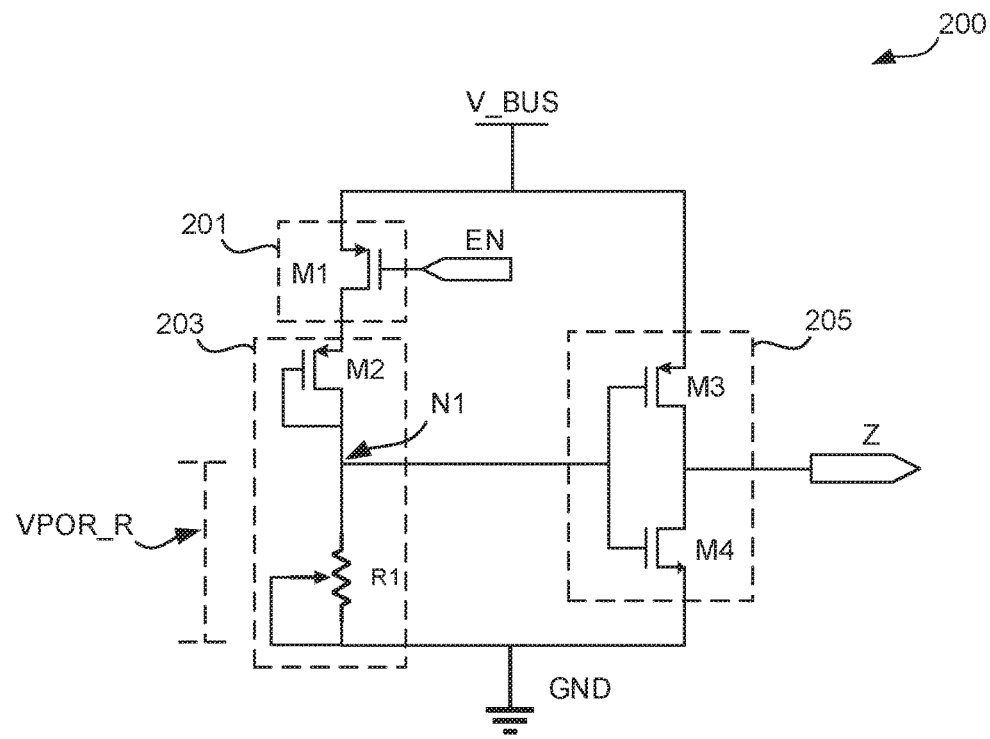
FIG. 2A depicts a schematic diagram of a gated voltage detector circuit used to detect a voltage in a system having a low quiescent current reset circuit, according to various embodiments.

FIG. 2A depicts a schematic diagram of a gated voltage detector circuit (hereinafter, "voltage divider circuit") 200, according to various embodiments. The voltage detector circuit 200 can be an example of the voltage detector circuit 115 (FIG. 1A), configured to detect a supply voltage V_BUS rising above a threshold voltage level, such as VPOR_R. Such voltage detector circuit can include a gating circuit 201, a voltage divider circuit 203, and an inverter 205. The gating circuit 201 can include a P-type field effect transistor (PFET) M1. The voltage divider circuit 203 can include a diode-connected PFET M2 and an adjustable resistor R1. Additionally, the inverter circuit 205 can include a PFET M3 and an NFET M4.

The gating circuit 201 and the voltage divider circuit can be used to determine a rising threshold voltage (VPOR_R) using equation (1) and equation (2) for a specified geometry $$\left(\frac{W_{P1}}{L_{P1}}\right),$$

threshold voltage ($V_{TP1}$), and process factor ($K_P$) of M2, a specified geometry $$\left(\frac{W_{P2}}{L_{P2}}\right),$$

threshold voltage ($V_{TP2}$), and process factor ($K_P$) of M3, and a specified geometry $$\left(\frac{W_N}{L_N}\right),$$

threshold voltage ($V_{TN}$), and process factor ($K_N$) of M4. Generally, VPOR_R can be determined by adjusting R1, or by changing the geometry to M2, M3 or M4. The voltage $V_g$ in equation (1) and equation (2) can be the gate-to-source voltage of M1.

$$\frac{V_g}{R1} = 0.5 \cdot K_P \frac{W_{P1}}{L_{P1}}(VPOR_R - V_g + V_{TP1})^2 \quad (1)$$

$$0.5 \cdot K_N \frac{W_N}{L_N}(V_g - V_{TN})^2 = 0.5 \cdot K_P \frac{W_{P2}}{L_{P2}}(VPOR_R - V_g + V_{TP2})^2 \quad (2)$$

The voltage detector circuit 200 can be turned on by presenting a low signal at terminal EN, such as to turn on M1. The threshold voltage VPOR_R can determine a bias voltage of M4, such as to determine the voltage required at node N1 to cause the inverter 205 to switch from generating a high output to a low output. As V_BUS rises from a low potential, such as ground GND, to VPOR_R, the voltage at node N1 can be lower than this bias voltage, causing the inverter 205 to generate a high output signal at terminal Z which closely tracks V_BUS. The voltage at node N1 can rise above the biasing voltage of M4 when V_BUS rises above VPOR_R, causing the inverter 205 to drive the output signal low, such as to indicate that V_BUS has reached a minimum operating voltage level.

The output signal can be captured from terminal Z by a POR latch circuit, such as POR latch circuit 120 (FIG. 1). The voltage detector 200 can then be turned off, or disabled, by presenting a low signal at terminal EN, such as to turn off of M1. Since latch circuits can consume less power than the power dissipated by R1, storing the Z in a POR latch and disabling the voltage detector circuit 200 can reduce power consumption in some systems.

Figure 2B:
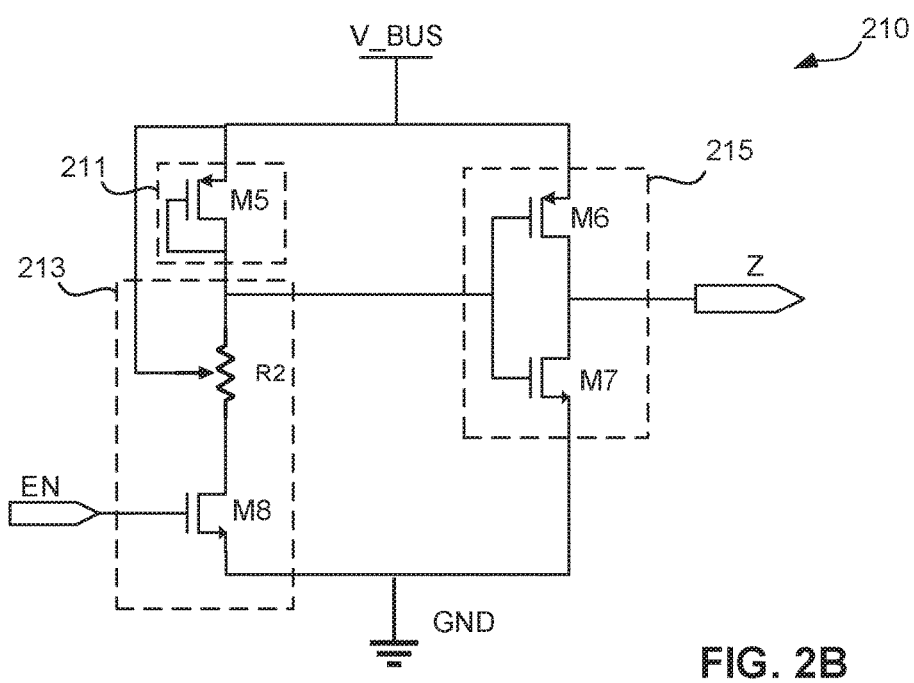
FIG. 2B depicts a schematic diagram of a gated voltage detector circuit used to detect a voltage in a system having a low quiescent current reset circuit, according to various embodiments.

FIG. 2B depicts a schematic diagram of another example of gated voltage detector circuit 210, according to various embodiments. The voltage detector circuit 210 can be an example of the voltage detector circuit included in brown-out detector circuit 110 (FIG. 1), configured to detect a supply voltage V_BUS falling below a threshold voltage level, such as a VPOR_FL. Such voltage detector circuit can include a gating circuit 211, a voltage divider circuit 213, and an inverter 215. The gating circuit 201 can include a NFET M8. The voltage divider circuit 213 can include a diode-connected PFET M5 and an adjustable resistor R2. Additionally, the inverter circuit 215 can include a PFET M6 and an NFET M7. Transistors M5, M6, and M7, can be selected to match transistors M2, M3, and M4 of the voltage detector circuit 200. The threshold voltage VPOR_FL can be determined according to equation (1) and equation (2) by substituting VPOR_FL for VPOR_R, and R2 for R1. The value of R2 can be larger than the value of R1, such as to cause VPOR_FL to be lower than VPOR_R.

The voltage detector circuit 210 can be turned off by applying a low voltage to M8 or turned on by applying a high voltage to M8. In the off state, the voltage detector 210 can cause the inverter 215 to generate a low output voltage at terminal Z. In the on state, the voltage detector can continue to generate a low output voltage at terminal Z until V_BUS falls below VPOR_FL. The voltage detector 210 can generate a high output voltage at terminal Z until V_BUS falls below VPOR_FL.

Figure 3:
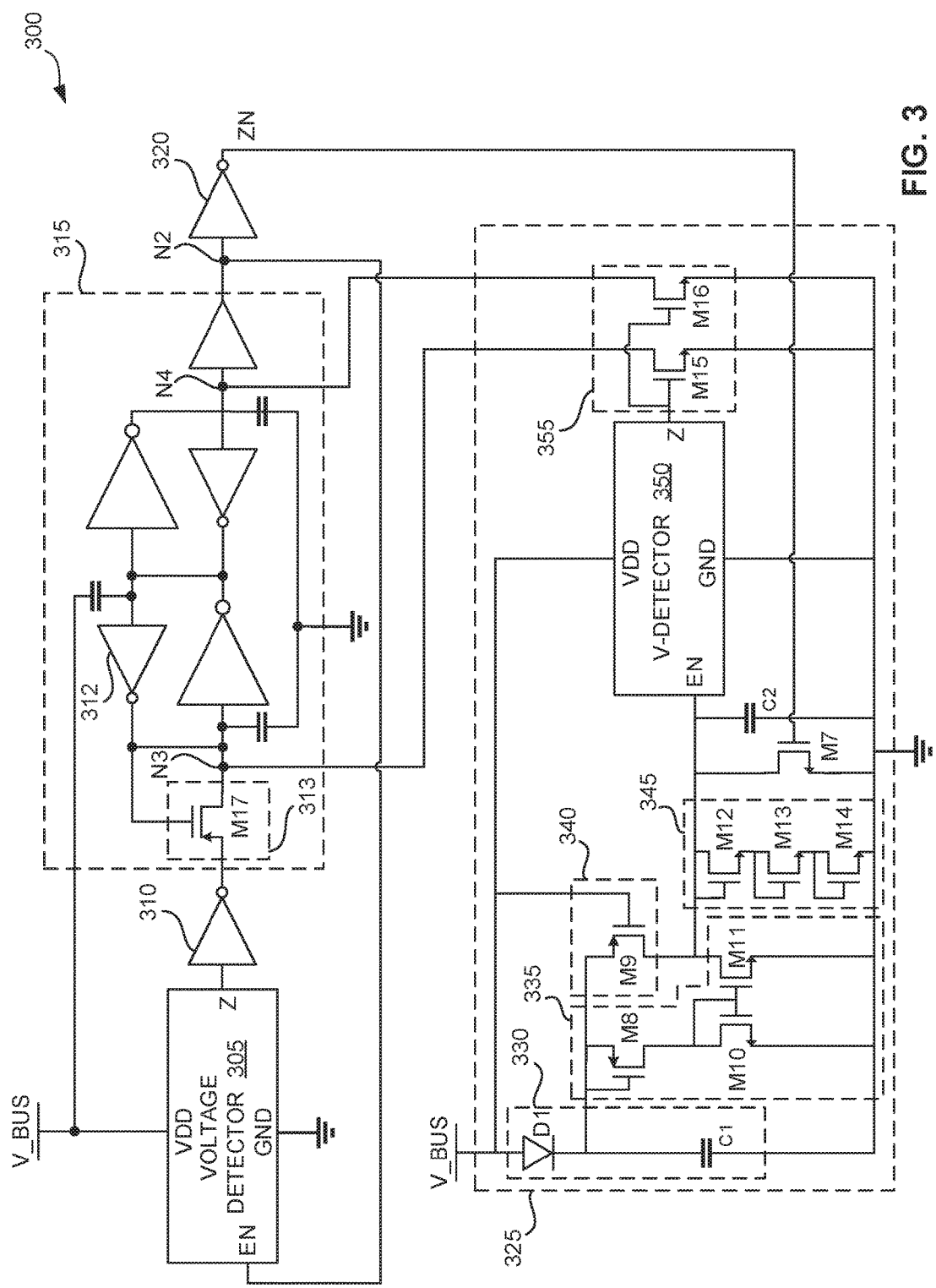
FIG. 3 depicts a schematic diagram of a low quiescent current reset circuit, according to various embodiments.

FIG. 3 depicts a schematic diagram of a low quiescent current reset circuit 300, according to various embodiments. The low quiescent current reset circuit (hereinafter, "reset circuit") 300 can be an example of the reset circuit 100 (FIG. 1A). The reset circuit 300 can include a voltage detector circuit 305, an inverter circuit 310, a POR latch circuit 315, an inverter circuit 320, and a brown-out detector circuit 325. The voltage detector circuit 305 can be an example of the voltage detector circuit 115 (FIG. 1A) or the voltage detector circuit 200 (FIG. 2A). Such circuits can be configured to detect an increase in a supply voltage V_BUS above a threshold voltage VPOR_R (FIG. 1B), as described herein.

The combination of the POR latch circuit 315 and the inverter 320 can be an example of the POR latch circuit 120 (FIG. 1). The POR latch circuit 315 can include a switching circuit 313 that is configured, such as by using a PFET M17, to be closed as V_BUS rises from a low voltage to VPOR_R. While V_BUS is below VPOR_R, the out of the voltage detector 305 (a high voltage) can be inverted by inverter circuit 310 and passed through the POR latch circuit 315 to generate a high reset signal ZN. The inverted output of the voltage detector circuit 305 can cause the POR latch circuit 315 to generate low output of node N2, such as to drive the terminal EN of the voltage detector circuit 305 low. This can to close the gating transistor M1 (FIG. 2A), keeping the voltage detector circuit 305 in an on state. When V_BUS rises above VPOR_R, the output of the voltage detector circuit 305 switches to a low voltage. This low output can be inverted high by the inverter 310 and passed to the latch circuit 315. This high input can cause inverter 312 to generate a high voltage at the base of PFET M17, such as to electrically isolate the POR latch circuit 315 from the voltage detector 305, such as to capture or latch the inverted output of the voltage detector circuit 305. The latched (high voltage) output can cause the POR latch circuit 315 to generate a high voltage at node N2, such as to turn off, or disable, the voltage detector circuit 305.

The brown-out detector circuit 325 can be an example of the brown-out detector circuit 110 (FIG. 1A), configured to detect a drop in V_BUS below a threshold voltage VPOR_FL (FIG. 1B). The brown-out detector circuit 325 can include a charge storage circuit 330, a leakage charge compensation circuit 335, a falling detector circuit 340, a voltage detector 350, and a reset device 355. The brown-out detector circuit 325 can also include a pulldown circuit 345, a reset transistor M7, and a capacitor C5.

The charge storage circuit 315 can include a diode D1 and a storage capacitor C1. The charge storage circuit 315 can determine a threshold voltage VPOR_FH (FIG. 1B) for activating the voltage detector circuit 350. The threshold voltage can be determined by using one or more diodes D1 determine a voltage developed across storage capacitor C1. Such threshold voltage (VPOR$_{FH}$) can be determined using equation (3) given k diodes D1, each having a forward-voltage $V_D$, and threshold voltage VTP of PFET M9. The storage capacitor C1 can be charged to VPOR_FH (VPOR$_{FH}$), as determined by D1, as V_BUS rises to a maximum, or normal, operating voltage V_BUS$_{MAX}$. In some embodiments, VPOR_FH, or the number diodes D1 (k), can be selected to determine the amount to time that the voltage detector 350 is turned on, such as by determining the width of region C in FIG. 1B.

$$\text{VPOR}_{FH}=V\_\text{BUS}_{MAX}-k\cdot V_D+\text{VTP} \quad (3)$$

The falling detector circuit 340 can include a PFET M9 having a gate coupled to V_BUS and a source coupled to storage capacitor C1. The falling detector circuit 340 can be configured to detect a drop in V_BUS below VPOR_FH by turning on to discharge the storage capacitor C1 when V_BUS falls more than VTP volts below VPOR_FH. When V_BUS has a long fall time, M9 can partially turn on, causing charge to leak from storage capacitor C1. Such leakage can limit the ability of M9 to detect V_BUS falling below VPOR_FH. The leakage charge compensation circuit can limit the charge leaked from storage capacitor C1, such as by using the diode connected PFET M8 to sense the charge leaked from C1, such as to cause the current mirror formed by an NFET M10 and an NFET M11 to mirror the leaked charge to the drain of M9. This configuration can improve the robustness of the brown-out detector circuit 325 to PVT various and to different supply voltage characteristics which can affect current leakage from C1.

The pulldown circuit 345 can include diode connected NFETs M12, M13, and M14. This circuit can pull charge away from the gating transistor in the voltage detector circuit 350 when M9 is turned off, such as to disable the voltage detector 350. The pulldown circuit 345 can also ensure that the voltage dropped across capacitor C5 is a large enough to turn on the gating transistor in the voltage detector 350 when M9 is turned on.

The voltage detector 350 can be voltage detector such as the voltage detector 210 (FIG. 2B), configured to detect V_BUS falling below the threshold voltage VPOR_FL. Once turned on, the voltage detector 350 can monitor V_BUS and generate a low output voltage at terminal Z until V_BUS falls below VPOR_FL. After V_BUS falls below VPOR_FL, the voltage detector 350 can drive a high output voltage at terminal Z, such as to cause NFET M15 and NFET M16 in the reset circuit 355 to pull down nodes N3 and N4, respectively, to reset the POR latch circuit 315, such as to cause to the POR latch to store a low voltage or a logical 0. Resetting latch circuit 315 can cause inverter circuit 320 to drive ZN high, as shown in region D of FIG. 1. Driving ZN high can turn on NFET M7 and cause the gate of the gating transistor in voltage detector circuit 350 to be pulled low, disabling the voltage detector circuit 350.

Figure 4:
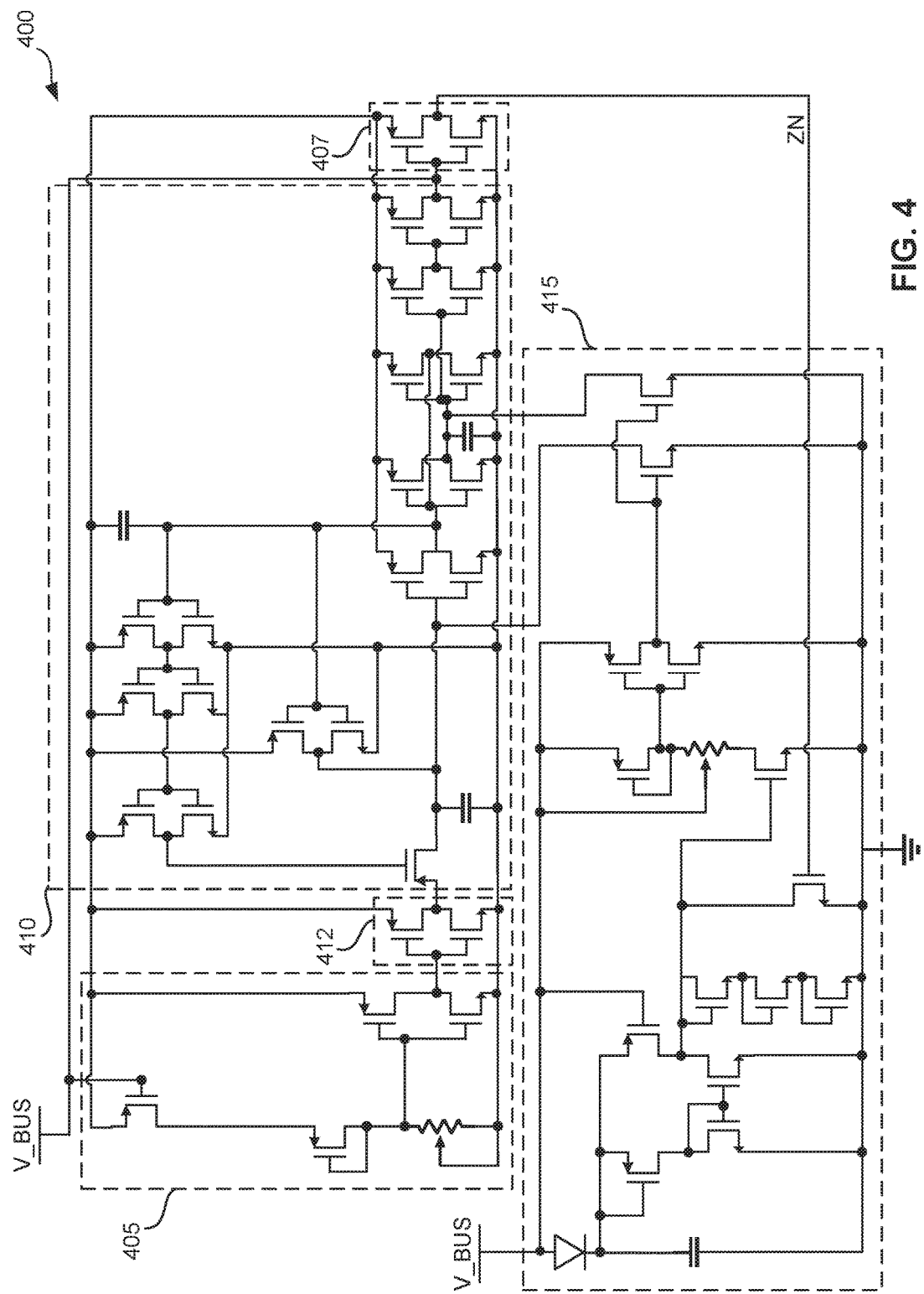
FIG. 4 depicts a transistor level schematic diagram of a low quiescent current reset circuit, according to various embodiments.

FIG. 4 depicts a transistor level schematic diagram of an example of a low quiescent current reset circuit 400, according to various embodiments. The reset circuit 400 can be an example of the reset circuit 105 (FIG. 1) or the reset circuit 300 (FIG. 3). The reset circuit can include rising voltage detector 405, inverter 407, POR latch circuit 410, inverter 412, and brown-out detector circuit 415, such as to correspond, respectively, to the voltage detector 305, the inverter 320, the POR latch circuit 415, the inverter 310, and the brown-out detector circuit 325 of FIG. 3. In some embodiments, the reset circuit 400 can be included in an integrated circuit, such as to provide a reset signal ZN to one or more sequential logic circuits in response to a condition of a supply voltage, as described herein.

Figure 5:
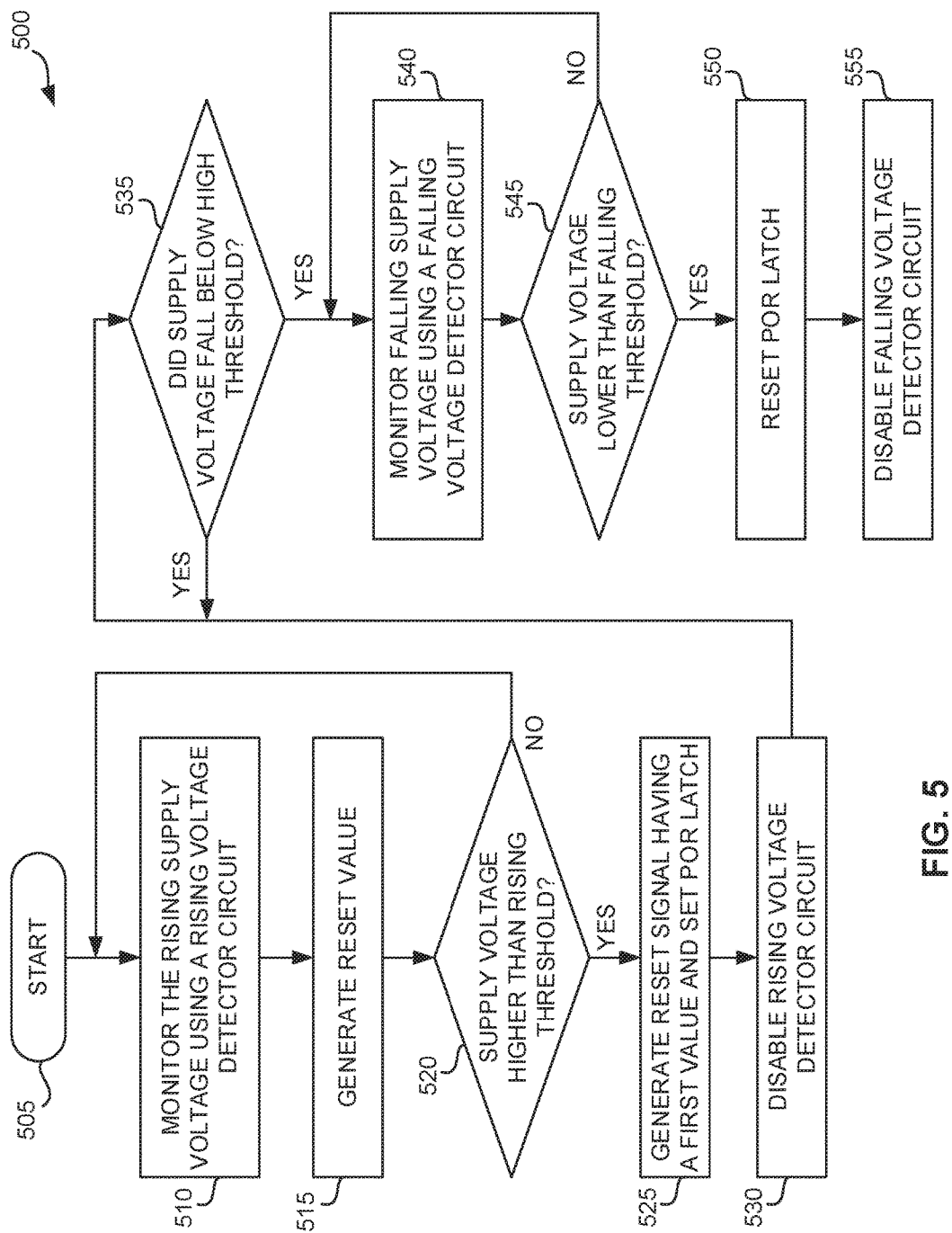
FIG. 5 depicts a set of operations for operating a low quiescent current reset circuit, according to various embodiments.

FIG. 5 depicts a set of operations 500 for operating a low quiescent current reset circuit, according to various embodiments. The operations 500 can be executed to reset one or more sequential logic circuits in response to a supply voltage rising above a rising threshold voltage level, such as VPOR_R in FIG. 1B. The operations 500 can also be executed to reset one or more sequential logic circuits in response to a supply voltage falling, form an operating voltage, below a falling threshold voltage level, such as VPOR_FL in FIG. 1B. The operations 500 can be started at operation 505, such as by ramping, or increasing, a supply voltage of an electronic device having one or more sequential logic circuit. Operation 510 can be executed to monitor the rising supply voltage using a first circuit, such as a rising voltage detector circuit, such as the voltage detector circuit 115 (FIG. 1A) or the voltage detector circuit 200 (FIG. 2A). Operation 515 can then be executed to generate a reset signal having a first value, such as a logic 1 or a high voltage, to reset the one or more synchronous logic circuits. Operation 520 can be executed to determine whether the supply voltage is higher than the rising threshold voltage level. The operations 500 can be continued at operation 510 when the supply voltage is not higher than the rising threshold voltage level. Alternatively, operation 525 can be executed to generate a reset signal having a second value when the supply voltage is higher than the rising threshold voltage. Operation 525 can be further executed to store the second value in a memory or latch circuit, such as the POR latch circuit 120 (FIG. 1) or the POR latch circuit 315 (FIG. 3). The second value can be a logic 0 or a low voltage selected to release the one or more logic circuits to operate. Operation 530 can then be executed to disable the first circuit, such as by turning off a gating transistor, or a gating circuit, associated with a rising voltage detector circuit, as described herein.

Operation 535 can be executed monitor the supply voltage to determine whether the supply voltage has fallen below a high falling voltage threshold level, such VPOR_FH in FIG. 1B. Operation 535 can be executed using a falling voltage detector circuit in conjunction with a charge storage circuit and a leakage current compensator, as described herein. Execution of the operations 500 can continue at operation 505 or at operation 535 when the supply voltage has not fallen below the high falling voltage threshold level. Alternatively, execution of the operations 500 can continue at operation 540 when the supply voltage has fallen below the high falling voltage threshold level.

Operation 540 can be executed to monitor the falling supply voltage to detect the supply voltage falling below a low falling voltage threshold level, such as VPOR_FL in FIG. 1B, such as by using a falling voltage detector circuit, as described herein. Execution of the operations 500 can continue at operation 540 until the supply voltage falls below the low falling voltage threshold level, while execution of the operations 500 can continue at operation 550 when the supply voltage falls below the low falling voltage threshold level, as shown in operation 545. Operation 550 can be executed to reset the POR latch, such as to cause the POR latch to store the first value, as described herein. Operation 555 can then be executed to disable the falling voltage detector circuit.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A device for providing a reset signal to one or more sequential logic circuits in an electronic system, the device comprising:
   a reset circuit comprising a first voltage detector circuit, the reset circuit to generate a first reset signal responsive to the first voltage detector circuit detecting a rise of a supply voltage above a first voltage level;
   a brown-out circuit comprising a charge storage circuit, a compensator circuit, and a second voltage detector circuit, the brown-out circuit to generate a second reset signal responsive to the second voltage detector circuit detecting a drop of the supply voltage below a second voltage level, the compensator circuit comprising a current mirror to limit leakage current from the charge storage circuit; and
   a latch circuit to provide the first reset signal and the second reset signal, and to disable the first voltage detector circuit and the second voltage detector circuit.

2. The device of claim 1, wherein the brown-out circuit further comprises a falling detector circuit coupled to the charge storage circuit, the falling voltage detector circuit configured to activate the second voltage detector circuit responsive to detecting a drop in the supply voltage below the third voltage level, the third voltage level established by the charge storage circuit.

3. The device of claim wherein the third voltage level is further established by a diode coupled in series with a storage capacitor between a first rail generating the supply voltage and a low rail generating the supply voltage.

4. The device of claim 2, wherein the compensator circuit is further to:
   detect the leakage current leaked from the charge storage device an input node of the falling circuit detector, and
   generate, using the current mirror, a mirrored current at an output node of the fa ng detector circuit based on the sensed leakage current.

5. The device of claim 2, wherein the falling detector circuit comprises:
   a transistor having a bias voltage determined by the voltage established by the charge storage circuit; and
   a gate voltage determined by the supply voltage.

6. The device of claim 1, wherein the current mirror comprises a diode-connected P-type field-effect transistor configured to detect the leakage current from the charge storage circuit.

7. The device of claim 1, wherein the first voltage detector circuit comprises:
   an inverter circuit to detect the rise of the supply voltage above the first voltage level; and
   a gated voltage divider circuit coupled to an input of the inverter circuit o determine the first voltage level.

8. The device of claim 7, wherein the gated voltage divider circuit comprises:
   a diode connected transistor coupled to a first rail generating the supply voltage;
   a resistive element coupled between the diode connected transistor and a second rail generating the supply voltage, the resistive element adjustable to determine the first voltage level based on a portion of the supply voltage dropped across the diode connected transistor a portion of the supply voltage dropped across resistive element; and
   a gating device to decouple the diode connected transistor first rail responsive to the rise of the supply voltage above the first voltage level.

9. The device of claim 1, wherein the second voltage detector circuit comprises a gated voltage divider circuit, the gated voltage divider circuit comprising:
   a diode connected transistor coupled to a first rail generating the supply voltage;
   a resistive element coupled between the diode connected transistor and a second rail generating the supply voltage, the resistive element adjustable to determine the second voltage level; and
   a gating device to decouple the resistive element from the second rail of the supply voltage responsive to the rise of the supply voltage above the first voltage level.

10. A method for operating low quiescent current reset circuit to reset a logic circuit in system, the method comprising:
   detecting, using a first circuit, that a supply voltage rose above a first voltage level;
   generating, in response to detecting that the supply voltage rose above the first voltage level a first signal to inhibit reset of the logic circuit;
   storing, in a memory circuit, a value that is indicative of the first signal;
   detecting, using a second circuit, that the supply voltage fell below a second voltage level;

generating, in response to detecting that the supply voltage fell below the second voltage level, a second signal to reset the logic circuit;

storing, in the memory circuit, a value that is indicative of the second signal;

disabling the first circuit and the second circuit based on a value stored in the memory circuit.

11. The method of claim 10, further comprising:

determining the second voltage level using a charge storage circuit;

discharging the charge storage circuit using a falling voltage detector circuit in response to detecting the drop in the supply voltage below a second voltage level; and limiting the discharge of the charge storage circuit using a current compensation circuit.

12. The method of claim 11, further comprising:

activating, using a current generated by discharging the charge compensation circuit, the second circuit to monitor the supply voltage.

13. The method of claim 11, wherein the current compensation circuit comprises a current mirror circuit configured to sample a current generated by the discharging of the charge storage circuit and to mirror a current proportional to the current generated by the discharging to an output of the falling voltage detector circuit.

14. The method of claim 11, further comprising:

determining the second voltage level using a diode coupled in series to a capacitor in the charge storage circuit.

15. The method of claim 10, further comprising:

determining the first voltage level using a diode coupled in series with a variable resistive element.

16. A system having low quiescent current reset circuit, the system comprising:

a first detector circuit to generate, in response to detecting a rise of a supply voltage above a first voltage level, a first signal to inhibit reset of a logic circuit;

a second detector circuit to generate, in response to detecting a drop of the supply voltage below a second voltage level, a second signal to reset the logic circuit; and a latch circuit to disable the first detector circuit and the second detector circuit.

17. The system of claim 16, wherein the latch circuit is configured to store a first value and a second value, the first value being indicative of the first signal, and the second value being indicative of the second signal.

18. The system of claim 16, further comprising:

a charge storage circuit to determine the second voltage level; and a charge compensation circuit to limit discharge of the charge storage circuit.

19. The system of claim 16, wherein the first detector circuit comprises:

an inverter circuit to detect the rise of a supply voltage above a first voltage level; and a gated voltage divider circuit to determine the first voltage level.

20. The system of claim 19, wherein the gated voltage divider circuit comprises:

a diode connected transistor coupled to a first rail generating the supply voltage;

a resistive element coupled between the diode connected transistor and a second rail generating the supply voltage, the resistive element adjustable to determine the first voltage level based on a portion of the supply voltage dropped across the diode connected transistor a portion of the supply voltage dropped across resistive element.

* * * * *

UNITED STATES PATENT AND TRADEMARK OFFICE
CERTIFICATE OF CORRECTION

PATENT NO. : 10,651,840 B2
APPLICATION NO. : 15/954204
DATED : May 12, 2020
INVENTOR(S) : Qin et al.

Page 1 of 1

It is certified that error appears in the above-identified patent and that said Letters Patent is hereby corrected as shown below:

In the Claims

Column 9, Line 65, Claim 2, delete "falling detector circuit" and insert --falling voltage detector circuit-- therefor Column 10, Line 4, Claim 3, delete "claim" and insert --claim 2,-- therefor Column 10, Line 13, Claim 4, delete "fa ng detector circuit" and insert --falling voltage detector circuit-- therefor Column 10, Lines 15-16, Claim 5, delete "falling detector circuit" and insert --falling voltage detector circuit-- therefor Column 10, Line 29, Claim 7, delete "o" and insert --to-- therefor Column 10, Line 41, Claim 8, after "transistor", insert --from the--

Column 10, Line 62, Claim 10, after "level", insert --,--

Signed and Sealed this
Sixteenth Day of June, 2020

Andrei Iancu
*Director of the United States Patent and Trademark Office*